United States Patent
Chen

(10) Patent No.: US 12,457,708 B2
(45) Date of Patent: Oct. 28, 2025

(54) COMPOSITE THERMOSTATIC COOLING SYSTEM

(71) Applicant: Wexten Precise Industries Co., Ltd., Taichung (TW)

(72) Inventor: Ling-Chun Chen, Taichung (TW)

(73) Assignee: Wexten Precise Industries Co., Ltd., Taichung (TW)

(*) Notice: Subject to any disclaimer, the term of this patent is extended or adjusted under 35 U.S.C. 154(b) by 280 days.

(21) Appl. No.: 18/319,525

(22) Filed: May 18, 2023

(65) Prior Publication Data
US 2024/0389265 A1    Nov. 21, 2024

(51) Int. Cl.
*H05K 7/20* (2006.01)
*H01M 10/613* (2014.01)
*H01M 10/6569* (2014.01)

(52) U.S. Cl.
CPC ..... *H05K 7/20281* (2013.01); *H05K 7/20209* (2013.01); *H05K 7/20381* (2013.01); *H01M 10/613* (2015.04); *H01M 10/6569* (2015.04); *H05K 7/20236* (2013.01); *H05K 7/203* (2013.01); *H05K 7/20354* (2013.01)

(58) Field of Classification Search
CPC .......... H05K 7/20281; H05K 7/20209; H05K 7/20381; H05K 7/20236; H05K 7/203; H05K 7/20354; H01M 10/6569; H01M 10/613

See application file for complete search history.

(56) References Cited

U.S. PATENT DOCUMENTS

| | | | |
|---|---|---|---|
| 10,966,349 B1* | 3/2021 | Lau | G01F 1/74 |
| 11,729,948 B2* | 8/2023 | Alissa | H05K 7/20836 |
| | | | 361/679.53 |
| 2024/0130086 A1* | 4/2024 | Li | H05K 7/20281 |
| 2024/0347813 A1* | 10/2024 | Sheidler | H01M 10/613 |

* cited by examiner

*Primary Examiner* — Marc E Norman
(74) *Attorney, Agent, or Firm* — Wang Law Firm, Inc.

(57) ABSTRACT

A composite thermostatic cooling system includes at least two types of cooling devices. A first type cooling device adjusts the temperature of a storage space, and the liquid coolant thereof circulates in a first tube loop with a first heat exchanger. A second type cooling device adjusts the temperature of each heat generation source in each storage box in the storage space, and the liquid coolant thereof circulates in a second tube loop with a second heat exchanger. The temperatures of the two coolants are adjusted by a refrigerant circulating in a third tube loop including: a branch connected to an expansion valve and the first heat exchanger, another branch connected to another expansion valve and the second heat exchanger, and a main loop connected to a compressor, a condenser, a dryer and the two branches. Thus, the temperatures of the heat generation sources are maintained to be the same.

10 Claims, 10 Drawing Sheets

COMPOSITE THERMOSTATIC COOLING SYSTEM

BACKGROUND

Field of the Invention

The present invention relates to a thermostatic device, and more particularly to a composite thermostatic cooling system.

Description of Related Art

The existing thermostatic cooling system generally achieves cooling by using a single type of cooling device. For example, a storage space with a plurality of hard drives or batteries (i.e., heat generation sources) requires at least one liquid cooled air conditioner to maintain the storage space at a constant temperature, thus cooling the heat generation sources that are generating heat.

However, each heat generation source does not produce the same degree of heat at work. If only liquid cooled air conditioners are used to uniformly reduce the temperature of storage space in an attempt to reduce the temperature of each source, it will make it impossible for each source to maintain the same operating temperature uniformly.

SUMMARY

One objective of the present invention is to provide a composite thermostatic cooling system which can overcome the problem of the prior technology's inability to consistently maintain all the heat generation sources in a storage space at the same operating temperature by providing two types of cooling devices.

A composite thermostatic cooling system in accordance with an embodiment of the present invention is suitable for constant temperature control of a plurality of heat generation sources in a storage space, and comprises: a first type cooling device used to adjust a temperature of the storage space; a first heat exchanger for cooling a first coolant of the first type cooling device; a first tube loop in communication with the first type cooling device and the first heat exchanger, and used for the first coolant to circulate therein; a second type cooling device, including a set of storage boxes, each for storing a second coolant and at least one of the plurality of heat generation sources, wherein the second coolant is used to regulate the temperature of the plurality of heat generation sources in the storage box; a second heat exchanger for cooling the second coolant; a second tube loop in communication with the second type cooling device and the second heat exchanger, and used for the second coolant to circulate therein; a compressor for pressurizing a heat exchange medium; a condenser for cooling the heat exchange medium; a dryer for drying the heat exchange medium; two expansion valves for decompressing the heat exchange medium; and a third tube loop including a main loop and two branches, wherein the main loop is in communication with the compressor, the condenser, the dryer and the two branches, one of the branches is connected with one of the two expansion valves and the first heat exchanger, the other of the two branches is connected with the other of the two expansion valves and the second heat exchanger, and the third tube loop allows the heat exchange medium to circulate therein.

Optionally, the composite thermostatic cooling system further comprises: a heater used to heat the heat exchange medium and the first coolant; a first heating tube connected with the heater and the third tube loop located between the condenser and the dryer, and used to move the heat exchange medium from the condenser to the heater; a first switch disposed to the first heating tube and used for selective opening of the first heating tube; a second heating tube connected with the heater and the branch between the expansion valve and the first heat exchanger, and used to move the heat exchanger medium from the heater to the first heat exchanger; a second switch disposed to the first tube loop between an output end of the first heat exchanger and an output port of the first type cooling device, and used for selective opening of the first tube loop between the output end of the first heat exchanger and the first type cooling device; a third heating tube connected with the heater and the first tube loop between the output end of the first heat exchanger and the second switch, and used to move the first coolant to the heater from the first tube loop between the output end of the first heat exchanger and the second switch; a fourth heating pipe connected with the heater and the first tube loop between the second switch and the output port of the first type cooling device, and used for moving the first coolant from the heater to the first tube loop between the second switch and the output port of the first type cooling device; and a third switch disposed to the fourth heating tube and used to selectively open the fourth heating tube.

Optionally, the composite thermostatic cooling system further comprises: a coolant storage tank disposed on the first tube loop between an output end of the first heat exchanger and an output port of the first type cooling device and used for storage of the first coolant; a first temperature sensor disposed in the coolant storage tank and used to detect the temperature of the first coolant in the coolant storage tank; a second temperature sensor disposed to the first tube loop between the first type cooling device and an input end of the first heat exchanger and used to detect the temperature of the first coolant discharged from the first type cooling device; and a third temperature sensor disposed to the second tube loop between an output end of the second heat exchanger and the second type cooling device and used to detect the temperature of the second coolant moved back to the second type cooling device.

Optionally, the first type cooling device is a liquid cooled air conditioner, and the second type cooling device is a one-way immersion liquid cooling device.

A composite thermostatic cooling system in accordance with another embodiment of the present invention is suitable for constant temperature control of a plurality of heat generation sources in a storage space, and comprises: a first type cooling device used to adjust a temperature of the storage space; a first heat exchanger for cooling a first coolant of the first type cooling device; a first tube loop in communication with the first type cooling device and the first heat exchanger, and used for the first coolant to circulate therein; a second type cooling device, including a set of storage boxes, each for storing a second coolant and at least one of the plurality of heat generation sources, wherein the second coolant is used to regulate the temperature of the plurality of heat generation sources in the storage box; a second heat exchanger for cooling the second coolant; a second tube loop in communication with the second type cooling device and the second heat exchanger, and used for the second coolant to circulate therein; a compressor for pressurizing a heat exchange medium; a condenser for cooling the heat exchange medium; a dryer for drying the heat exchange medium; two expansion valves for decompressing the heat exchange medium; and a third tube loop including a main loop and two branches, wherein the main loop is in communication with the compressor, the condenser, the dryer and the two branches, one of the branches is connected with one of the two expansion valves and the first heat exchanger, the other of the two branches is connected with the other of the two expansion valves and the second heat exchanger, and the third tube loop allows the heat exchange medium to circulate therein. The composite thermostatic cooling system further comprises: a first coolant storage tank disposed on the first tube loop between an output end of the first heat exchanger and an output port of the first type cooling device and used for storage of the first coolant; a second coolant storage tank disposed on the second tube loop between an output end of the second heat exchanger and an output port of the second type cooling device and used for storage of the second coolant; a first temperature sensor disposed in the first coolant storage tank and used to detect the temperature of the first coolant in the first coolant storage tank; and a second temperature sensor disposed in the second coolant storage tank and used to detect the temperature of the second coolant in the second coolant storage tank.

Optionally, the composite thermostatic cooling system further comprises: a heater used to heat the heat exchange medium and the first coolant; a first heating tube connected with the heater and the third tube loop located between the condenser and the dryer, and used to move the heat exchange medium from the condenser to the heater; a first switch disposed to the first heating tube and used for selective opening of the first heating tube; a second heating tube connected with the heater and the branch between the expansion valve and the first heat exchanger, and used to move the heat exchanger medium from the heater to the first heat exchanger; a second switch disposed to the first tube loop between an output end of the first heat exchanger and an output port of the first type cooling device, and used for selective opening of the first tube loop between the output end of the first heat exchanger and the first type cooling device; a third heating tube connected with the heater and the first tube loop between the output end of the first heat exchanger and the second switch, and used to move the first coolant to the heater from the first tube loop between the output end of the first heat exchanger and the second switch; a fourth heating pipe connected with the heater and the first tube loop between the second switch and the output port of the first type cooling device, and used for moving the first coolant from the heater to the first tube loop between the second switch and the output port of the first type cooling device; and a third switch disposed to the fourth heating tube and used to selectively open the fourth heating tube.

Optionally, the composite thermostatic cooling system further comprises: a first temperature sensor disposed in the first coolant storage tank and used to detect the temperature of the first coolant in the first coolant storage tank; and a second temperature sensor disposed in the second coolant storage tank and used to detect the temperature of the second coolant in the second coolant storage tank.

Optionally, the first type cooling device is a liquid cooled air conditioner, and the second type cooling device is a dual-phase immersion liquid cooling device, a liquid heat dissipation device or a heat exchanger.

A composite thermostatic cooling system in accordance with a further embodiment of the present invention is suitable for constant temperature control of a plurality of heat generation sources in a storage space, and comprises: a first type cooling device used to adjust a temperature of the storage space; a first heat exchanger for cooling a first coolant of the first type cooling device; a first tube loop in communication with the first type cooling device and the first heat exchanger, and used for the first coolant to circulate therein; a second type cooling device, including a set of storage boxes, each for storing a second coolant and at least one of the plurality of heat generation sources, wherein the second coolant is used to regulate the temperature of the plurality of heat generation sources in the storage box; a second heat exchanger for cooling the second coolant; a second tube loop in communication with the second type cooling device and the second heat exchanger, and used for the second coolant to circulate therein; a compressor for pressurizing a heat exchange medium; a condenser for cooling the heat exchange medium; a dryer for drying the heat exchange medium; two expansion valves for decompressing the heat exchange medium; and a third tube loop including a main loop and two branches, wherein the main loop is in communication with the compressor, the condenser, the dryer and the two branches, one of the branches is connected with one of the two expansion valves and the first heat exchanger, the other of the two branches is connected with the other of the two expansion valves and the second heat exchanger, and the third tube loop allows the heat exchange medium to circulate therein. The set of storage boxes of the second type cooling device is defined as a first set of storage boxes, and the composite thermostatic cooling system further comprises: a third type cooling device includes a second set of storage boxes, each of the second set of the storage boxes is provided for storage of a third coolant and the at least one of the plurality of the heat generation sources, and the third coolant is used for regulating the temperature of the heat generation sources in each one of the second set of storage boxes; and a fourth tube loop is in communication with the third type cooling device and the second heat exchanger, and used for the third coolant to circulate therein.

Optionally, the composite thermostatic cooling system further comprises: a heater used to heat the heat exchange medium and the first coolant; a first heating tube connected with the heater and the third tube loop located between the condenser and the dryer, and used to move the heat exchange medium from the condenser to the heater; a first switch disposed to the first heating tube and used for selective opening of the first heating tube; a second heating tube connected with the heater and the branch between the expansion valve and the first heat exchanger, and used to move the heat exchanger medium from the heater to the first heat exchanger; a second switch disposed to the first tube loop between an output end of the first heat exchanger and an output port of the first type cooling device, and used for selective opening of the first tube loop between the output end of the first heat exchanger and the first type cooling device; a third heating tube connected with the heater and the first tube loop between the output end of the first heat exchanger and the second switch, and used to move the first coolant to the heater from the first tube loop between the output end of the first heat exchanger and the second switch; a fourth heating pipe connected with the heater and the first tube loop between the second switch and the output port of the first type cooling device, and used for moving the first coolant from the heater to the first tube loop between the second switch and the output port of the first type cooling device; and a third switch disposed to the fourth heating tube and used to selectively open the fourth heating tube.

Optionally, the composite thermostatic cooling system further comprises: a first coolant storage tank disposed on the first tube loop between an output end of the first heat exchanger and an output port of the first type cooling device and used for storage of the first coolant; a second coolant storage tank disposed on the fourth tube loop between an output end of the second heat exchanger and an output port of the third type cooling device and used for storage of the third coolant; a first temperature sensor disposed in the first coolant storage tank and used to detect the temperature of the first coolant in the first coolant storage tank; a second temperature sensor disposed to the first tube loop between the first type cooling device and an input end of the first heat exchanger and used to detect the temperature of the first coolant discharged from the first type cooling device; a third temperature sensor disposed to the second tube loop between an output end of the second heat exchanger and the second type cooling device and used to detect the temperature of the second coolant moved back to the second type cooling device; and a fourth temperature sensor disposed in the second coolant storage tank and used to detect the temperature of the second coolant in the second coolant storage tank.

Optionally, the first type cooling device is a liquid cooled air conditioner, the second type cooling device is a one-way immersion liquid cooling device, and the third type cooling device is a dual-phase immersion liquid cooling device, a liquid heat dissipation device or a heat exchanger.

BRIEF DESCRIPTION OF THE DRAWINGS

After studying the detailed description in conjunction with the following drawings, other aspects and advantages of the present invention will be discovered.

DETAILED DESCRIPTION

Figure 1:
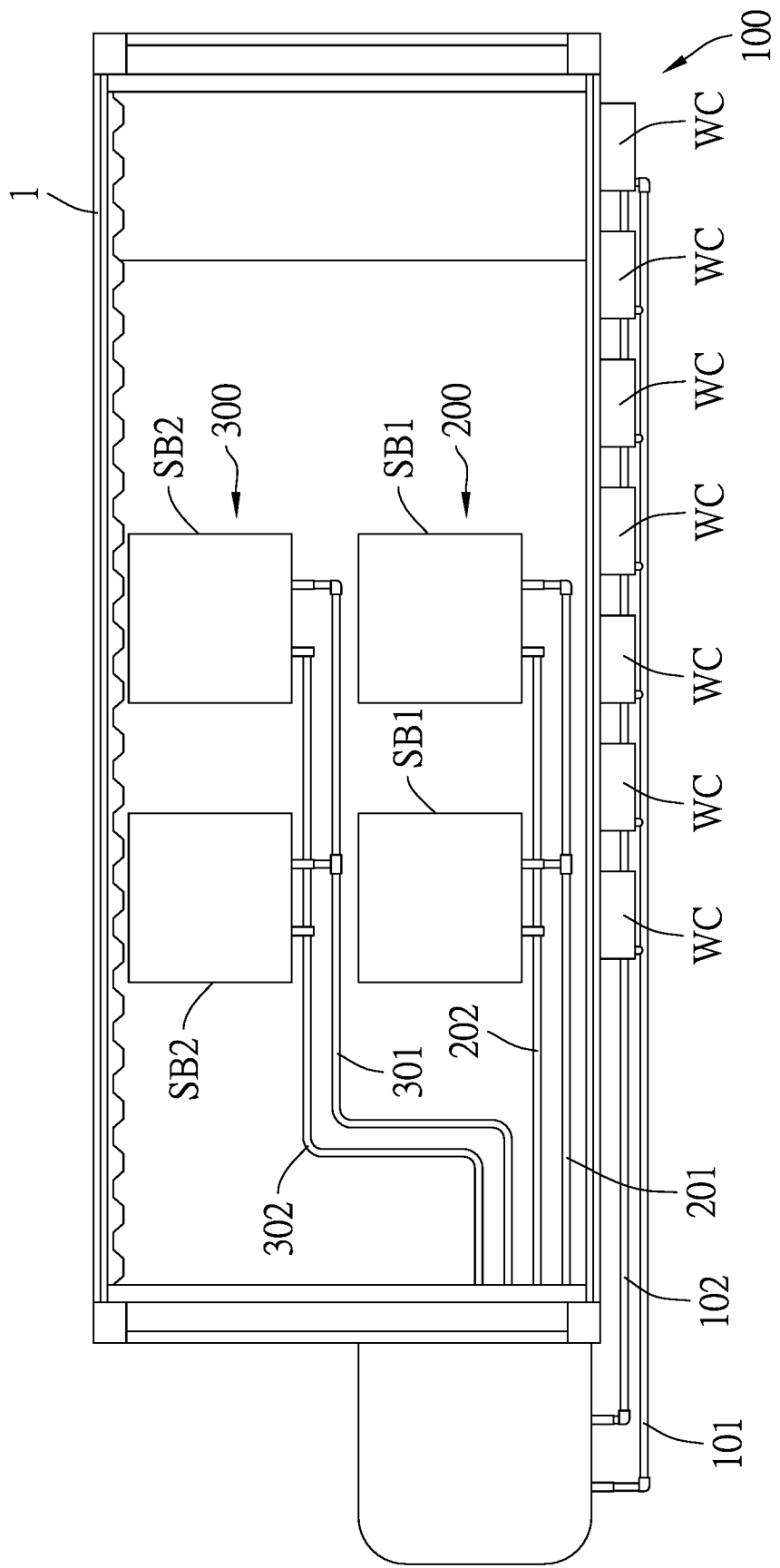
FIG. 1 is a schematic diagram of a part of a composite thermostatic cooling system applied to an energy storage cabinet according to an embodiment of the invention.
Figure 2:
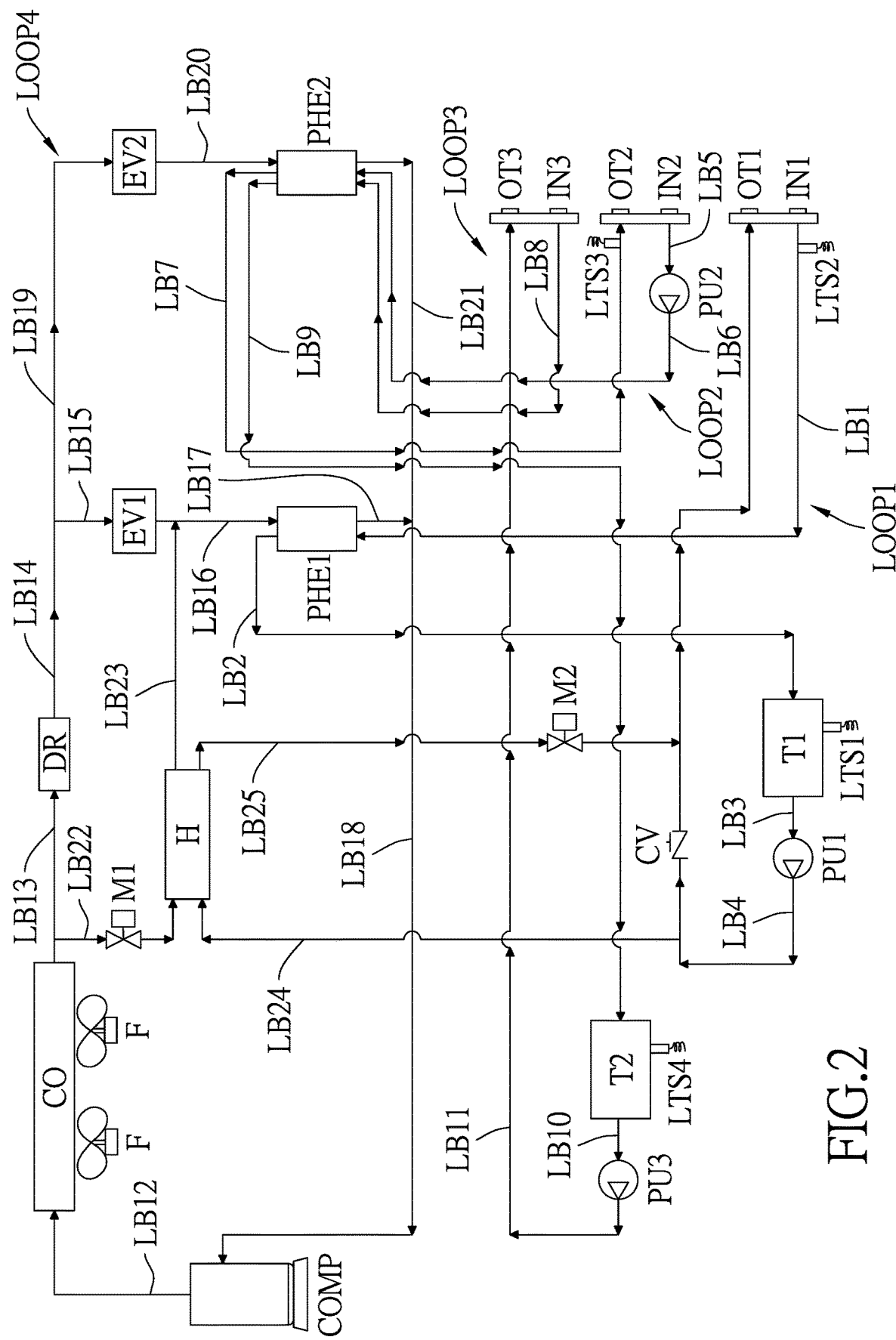
FIG. 2 is a schematic diagram of another part of a composite thermostatic cooling system according to an embodiment of the invention.

Refer to FIG. 1 and FIG. 2, the invention provides a composite thermostatic cooling system according to an embodiment, which is suitable for thermostatic control of an energy storage cabinet 1. A storage space of the energy storage cabinet 1 contains a plurality of heat generation sources (e.g. but not limited to batteries).

The composite thermostatic cooling system includes, but is not limited to, at least two types of cooling devices (e.g. but not limited to cooling devices 100~300), at least one coolant storage tank (e.g. but not limited to coolant storage tanks T1 and T2), a plurality of pumps (e.g. but not limited to pumps PU1~PU3), a first heat exchanger PHE1, a second heat exchanger PHE2, a compressor COMP, a condenser CO, a dryer DR, expansion valves EV1 and EV2 and a plurality of tubes (e.g. But not limited to tubes LB1~LB21).

The cooling device 100 (i.e., a first type cooling device) includes at least one liquid cooled air conditioner WC, one set of discharge tubes 101 and one set of injection tubes 102, and is able to regulate the internal temperature of energy storage cabinet 1. The liquid cooled air conditioner WC discharges coolant (i.e. the first coolant) through the discharge tubes 101 and injects coolant through the injection tubes 102 to maintain the temperature inside the energy storage cabinet 1 at a set value.

The discharge tubes 101 of the cooling device 100 are connected to the tube LB1 through an input port IN1, and the tube LB1 is connected to an input end of the first heat exchanger PHE1, so that the coolant of the cooling device 100 can be discharged to the first heat exchanger PHE1 for heat exchange (i.e. cooling). An output end of the first heat exchanger PHE1 communicates with the input end of the coolant storage tank T1 (i.e. the first coolant storage tank) through a tube LB2, whereby the coolant cooled by the first heat exchanger PHE1 can be discharged to the coolant storage tank T1 for storage (or accommodated therein). An output end of the coolant storage tank T1 is connected to an input end of the pump PU1 through a tube LB3, and an output end of the pump PU1 is connected to an output port OT1 through a tube LB4, and the output port OT1 is connected to the injection tubes 102 of the cooling device 100, so that the pump PU1 can draw the coolant out from the coolant storage tank T1 and push it back to the cooling device 100. The tubes LB1~LB4 can form a tube loop LOOP1 (i.e. the first tube loop).

The cooling device 200 (i.e., a second type cooling device), can be for example, but is not limited to a one-way immersion liquid cooling device, and includes a set of storage boxes SB1, a set of discharge tubes 201 and a set of injection tubes 202. One or more heat generation sources may be disposed in each of the storage boxes SB1, and the storage boxes SB1 are used to carry the coolant used to cool the one or more heat generation sources (i.e., the second coolant). Coolant can be discharged from each storage box SB1 by this set of discharge tubes 201, and can be injected into the storage boxes SB1 by the set of injection tubes 202, so that the coolant in each storage box SB1 can be maintained at a constant temperature, and the heat generation source in each storage box SB1 can be maintained at a constant temperature.

The discharge tubes 201 of the cooling device 200 are connected to a tube LB5 through an input port IN2, and the tube LB5 is connected to an input end of a pump PU2, and an output end of the pump PU2 is connected to an input end of the second heat exchanger PHE2 through a tube LB6, so that the pump PU2 can draw the coolant (i.e. the second coolant) out of the cooling device 200 and push it to the second heat exchanger PHE2 for heat exchange (i.e. cooling). An output end of the second heat exchanger PHE2 is connected to an output port OT2 through a tube LB7, and the output port OT2 is connected to the injection tubes 202 of the cooling device 200, so that the coolant cooled by the second heat exchanger PHE2 can be moved back to the cooling device 200. The tubes LB5~LB7 can constitute a tube loop LOOP2 (namely, a second tube loop).

The cooling device 300 (i.e., a second or third type cooling device) can be, for example, but is not limited to a dual-phase immersion liquid cooling device, a liquid heat dissipation device or a heat exchanger, and includes a set of storage boxes SB2, a set of discharge tubes 301 and a set of injection tubes 302. One or more heat generation sources may be disposed in each storage box SB2, in each of which is carried coolant (i.e., the second coolant or the third coolant) used to cool the one or more heat generation sources. Coolant can be discharged out of each storage box SB2 through the set of discharge tubes 301, and can be injected therein through the set of injection tubes 302, so that the coolant in each storage box SB2 can be maintained at a constant temperature, and the heat generation source in each storage box SB2 can be maintained at a constant temperature.

The discharge tubes 301 of the cooling device 300 are connected to a tube LB8 through an input port IN3, and the tube LB8 is connected to another input end of the second heat exchanger PHE2, so that the coolant of the cooling device 300 can be discharged to the second heat exchanger PHE2 for heat exchange (i.e. cooling). Another output end of the second heat exchanger PHE2 is connected to an input end of the coolant storage tank T2 (the second coolant storage tank) through a tube LB9, whereby the coolant cooled by the second heat exchanger PHE2 can be discharged to the coolant storage tank T2 for storage (or contained therein). An output end of coolant storage tank T2 is connected to an input end of a pump PU3 through a tube LB10, an output end of the pump PU3 is connected to an output port OT3 through a tube LB11, and the output port OT3 is connected to the injection tubes 302 of the cooling device 300, so that the pump PU3 can draw the coolant out from the coolant storage tank T2 and pump it back to the cooling device 300. The tubes LB8~LB11 can form a tube loop LOOP3 (the second tube loop or the fourth tube loop).

The compressor COMP can pressure heat exchange medium (also known as refrigerant). An output end of the compressor COMP is connected to an input end of the condenser CO through a tube LB12, whereby the condenser CO can dissipate heat (namely, cool down) from the heat exchange medium of the compressor COMP. An output end of the condenser CO is connected to an input end of the dryer DR through a tube LB13, whereby the dryer DR can dry the heat exchange medium from the condenser CO.

An output end of the dryer DR is connected to an input end of the expansion valve EV1 through tubes LB14 and LB15 which are connected with each other, whereby the expansion valve EV1 can decompress the heat exchange medium from the dryer DR. An output end of the expansion valve EV1 is connected to another input end of the first heat exchanger PHE1 through a tube LB16, whereby the first heat exchanger PHE1 can use the heat exchange medium from the expansion valve EV1 to do heat exchange to the coolant of the cooling device 100. Another output end of the first heat exchanger PHE1 is connected to an input end of the compressor COMP through tubes LB17 and LB18 which are connected with each other, so that the heat exchange medium discharged from the first heat exchanger PHE1 can be moved back to the compressor COMP.

The output end of the dryer DR is also connected to an input end of the expansion valve EV2 through tubes LB14 and LB19 which are connected with each other, whereby the expansion valve EV2 can decompress the heat exchange medium from the dryer DR. An output end of the expansion valve EV2 is connected to another input end of the second heat exchanger PHE2 through a tube LB20, whereby the second heat exchanger PHE2 can use the heat exchange medium from the expansion valve EV2 to do heat exchange to the coolant of the cooling devices 200 and 300. Another output end of the second heat exchanger PHE2 is connected to the input end of the compressor COMP through tubes LB18 and LB21 which are connected with each other, so that the heat exchange medium discharged from the second heat exchanger PHE2 can be collected and moved back to the compressor COMP.

The tubes LB12~LB21 can form a tube loop LOOP4 (namely, a third tube loop). The tubes LB15~LB17 can form a branch of the tube loop LOOP4, and the tubes LB19~LB21 can form another branch of the tube loop LOOP4. The tubes LB12~LB14 can form a main loop of the tube loop LOOP4, and the main loop is in communication with the compressor COMP, the condenser CO, the dryer DR and the two branches.

Moreover, the composite thermostatic cooling system includes, for example, but not limited to, a heater H, a plurality of switches (e.g., but not limited to switches M1 and M2 and switches CV) and a plurality of tubes (e.g., but not limited to tubes LB22~LB25). With the configuration of the heater H, the switches M1 and M2, the switches CV and the tubes LB22~LB25, the composite thermostatic cooling system has a heating function.

One input end of the heater H is connected to the output end of the condenser CO through the tube LB22 (i.e. the first heating tube) connected to the tube LB13, and a switch M1 (i.e. the first switch) is disposed on the tube LB22. Therefore, when the switch M1 is turned on, the tube LB22 will be opened, so the heat exchange medium from the condenser CO can be input to the heater H for heating; conversely, when the switch M1 is turned off, the tube LB22 will be closed. One output end of the heater H is connected to another input end of the first heat exchanger PHE1 through the tube LB23 (namely, the second heating tube) connected to the tube LB16, so that the first heat exchanger PHE1 can use the heat exchange medium from the heater H to adjust the temperature of the coolant of the cooling device 100 in the first heat exchanger PHE1, and in this way, the first coolant can actually reach the operating temperature. For example, if the predetermined temperature is 25-35 degrees Celsius, the first coolant must be between 10-15 degrees Celsius.

The switch CV (i.e., the second switch) is disposed on the tube LB4, and the tube LB4 located between the input end of the switch CV and the output end of the pump PU1 is connected to the tube LB24 (i.e., the third heating tube). The tube LB24 is connected to another input end of the heater H, and another output end of the heater H is connected to the tube LB25 (i.e., the fourth heating tube). The tube LB25 is connected to the tube LB4 located between the output end of the switch CV and the output port OT1. The switch M2 (namely, the third switch) is disposed on the tube LB25. When the switch CV is on but the switch M2 is off, the tube LB24 located between the input end and the output end of the switch CV is open, but the tube LB25 is closed, so that the coolant output from the pump PU1 can flow directly to the output port OT1 without passing through the heater H. On the contrary, when the switch CV is off but the switch M2 is on, the tube LB4 between the input end and the output end of the switch CV will be disconnected, and the tube LB25 is unblocked, so that the coolant from the pump PU1 can be fed into the heater H for heating, and then through the tube LB25 into the tube LB4 between the output end of the switch CV and the output port OT1, and thus being sent to the output port OT1.

In addition, the composite thermostatic cooling systems includes, for example, but not limited to, a plurality of temperature sensors (e.g., but not limited to temperature sensors LTS1~LTS4). A temperature sensor LTS1 (namely, the first temperature sensor) is set in the coolant storage tank T1 and can detect the temperature of the coolant in the coolant storage tank T1. A temperature sensor LTS2 (namely, the second temperature sensor) is disposed on the tube LB1 and can detect the temperature of coolant discharged from the cooling device 100. A temperature sensor LTS3 (namely, the third temperature sensor) is disposed on the tube LB7 and can detect the temperature of coolant being moved back to the cooling device 200. A temperature sensor LTS4 (namely, the third or fourth temperature sensor) is disposed in the coolant storage tank T2 and can detect the temperature of the coolant in the coolant storage tank T2.

Through the configuration shown in FIG. 1 and FIG. 2, the composite thermostatic cooling system of the invention can be adapted to perform different electrical controls according to different ambient temperatures, so that the energy storage cabinet 1 and its heating source can maintain constant temperature. Examples of different electrical controls are described below.

Figure 8:
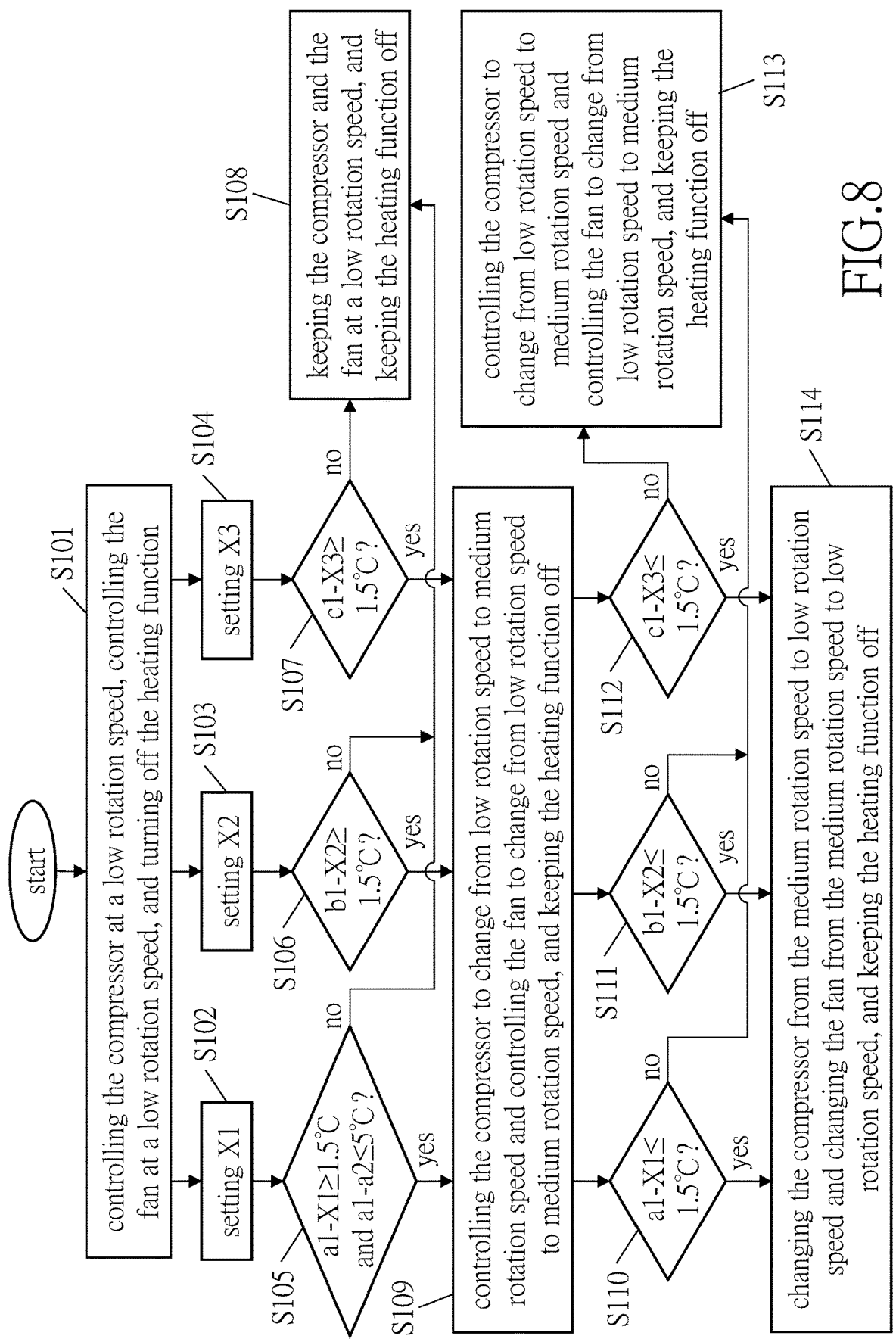
FIG. 8 is a flow chart of a control method of a composite thermostatic cooling system according to an embodiment of the invention.

Please refer to FIG. 1, FIG. 2 and FIG. 8, a control method of a composite thermostatic cooling system is provided according to an embodiment of the invention, which is suitable for thermostatic control of a energy storage cabinet 1 at the operating ambient temperature of 10° C.~35° C.

Firstly, the composite thermostatic cooling system is started to operate, so that the coolant of the cooling devices 100~300 starts to circulate in the tube loops LOOP1~LOOP3, the heat exchange medium circulates in the tube loop LOOP4, and the temperature of the coolant is monitored through the temperature sensors LTS1~LTS4.

Step S101: Controlling the compressor COMP at a low rotation speed, controlling the fan F of the condenser CO at a low rotation speed, and turning off the heating function (i.e. turning off the switches M1 and M2 and turning on the switch CV).

Step S102: Setting an operating temperature X1 of the coolant of the cooling device 100. The operating temperature X1 refers to the constant temperature at which the coolant of the cooling device 100 should be maintained.

Step S103: Setting an operating temperature X2 of the coolant of the cooling device 200. The operating temperature X2 refers to the constant temperature at which the coolant of the cooling device 200 should be maintained.

Step S104: Setting an operating temperature X3 of the coolant of the cooling device 300. The operating temperature X3 refers to the constant temperature at which the coolant of the cooling device 300 should be maintained.

Step S105: Determining whether a temperature a1 detected by the temperature sensor LTS1 minus the operating temperature X1 is greater than or equal to 1.5° C., and whether the temperature a1 minus a temperature a2 detected by the temperature sensor LTS2 is less than or equal to 5° C.

Step S106: Determining whether a temperature b1 detected by the temperature sensor LTS3 minus the operating temperature X2 is greater than or equal to 1.5° C.

Step S107: Determining whether the temperature detected by the temperature sensor LTS4 minus the operating temperature X3 is greater than or equal to 1.5° C.

In steps S105 to S107, if not, in step S108, keeping the compressor COMP and the fan F at a low rotation speed, and keeping the heating function off. Otherwise, in steps S105 to S107, if yes, in step S109, controlling the compressor COMP to change from low rotation speed to medium rotation speed and controlling the fan F to change from low rotation speed to medium rotation speed, and keeping the heating function off.

Step S110: Determining whether the temperature a1 minus the operating temperature X1 is less than or equal to 1.5° C.

Step S111: Determining whether the temperature b1 minus the operating temperature X2 is less than or equal to 1.5° C.

Step S112: Determining whether the temperature c1 minus the operating temperature X3 is less than or equal to 1.5° C.

In steps S110 to S112, if not, in step S113, controlling the compressor COMP to change from low rotation speed to medium rotation speed and controlling the fan F to change from low rotation speed to medium rotation speed, and keeping the heating function off. Otherwise, in steps S110 to S112, if yes, in step S114, changing the compressor COMP from the medium rotation speed to low rotation speed and changing the fan F from the medium rotation speed to low rotation speed, and keeping the heating function off.

Figure 9:
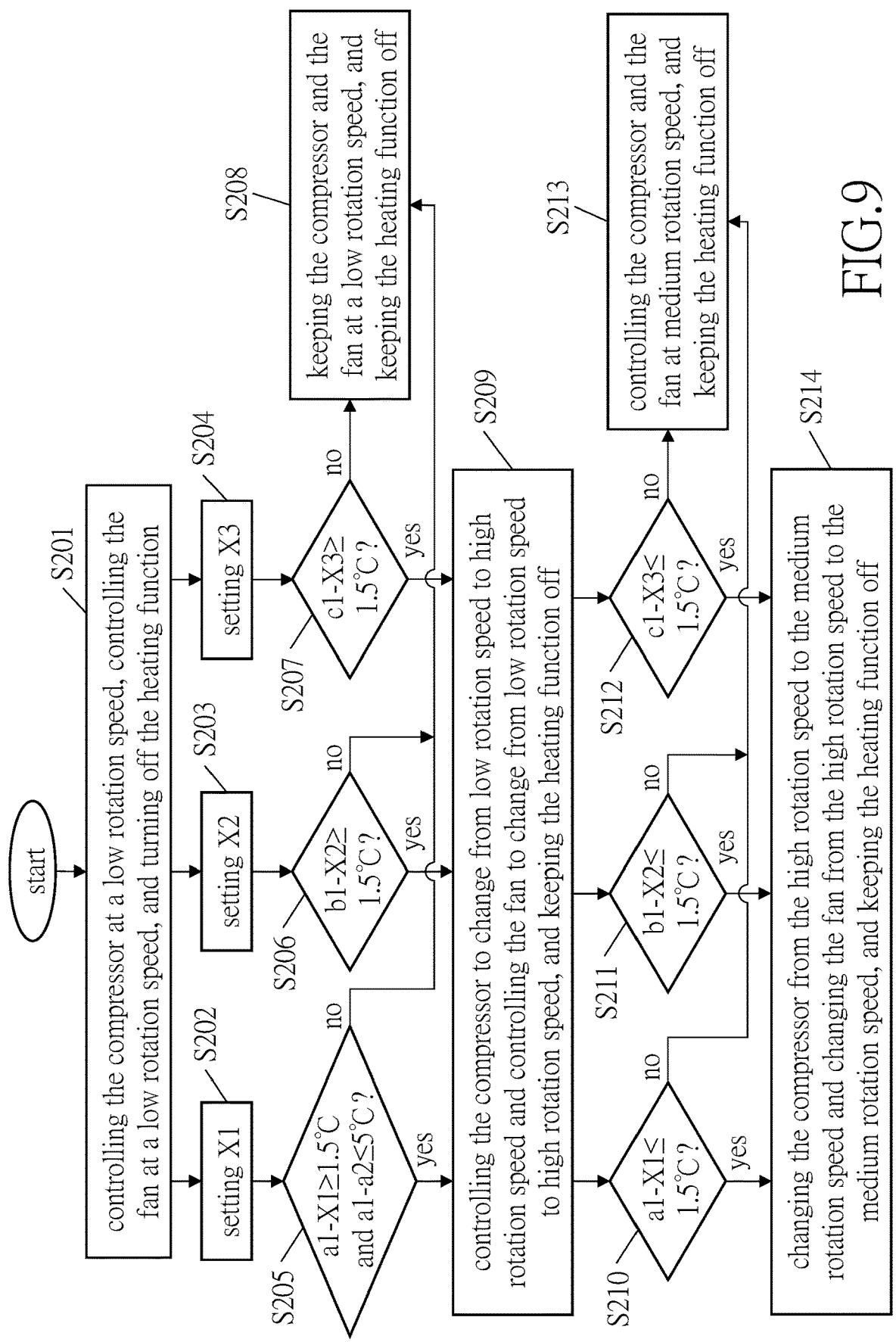
FIG. 9 is a flow chart of a control method of a composite thermostatic cooling system according to another embodiment of the invention.

Refer to FIG. 1, FIG. 2 and FIG. 9, a control method of a composite thermostatic cooling system is provided according to another embodiment of the invention, which is suitable for thermostatic control of the energy storage cabinet 1 at the operating ambient temperature of 36° C.~50° C.

Firstly, the composite thermostatic cooling system is started to operate, so that the coolant of the cooling devices 100~300 starts to circulate in the tube loops LOOP1~LOOP3, the heat exchange medium circulates in the tube loop LOOP4, and the temperature of the coolant is monitored through the temperature sensors LTS1~LTS4.

Steps S201~S208 are the same as steps S101~S108 and will not be repeated here.

In steps S205 to S207, if yes, in step S209, controlling the compressor COMP to change from low rotation speed to high rotation speed and change the fan F from low rotation speed to high rotation speed, and keeping the heating function off.

Steps S210~S212 are the same as steps S110-S112 and will not be repeated here.

In steps S210 to S212, if not, in steps S213, controlling the compressor COMP at medium rotation speed and the fan F at medium rotation speed, and keeping the heating function off. Otherwise, in steps S210 to S212, if yes, in steps S214, controlling the compressor COMP to change from high rotation speed to medium rotation speed, controlling the fan F to change from high rotation speed to medium rotation speed, and keeping the heating function off.

Figure 10:
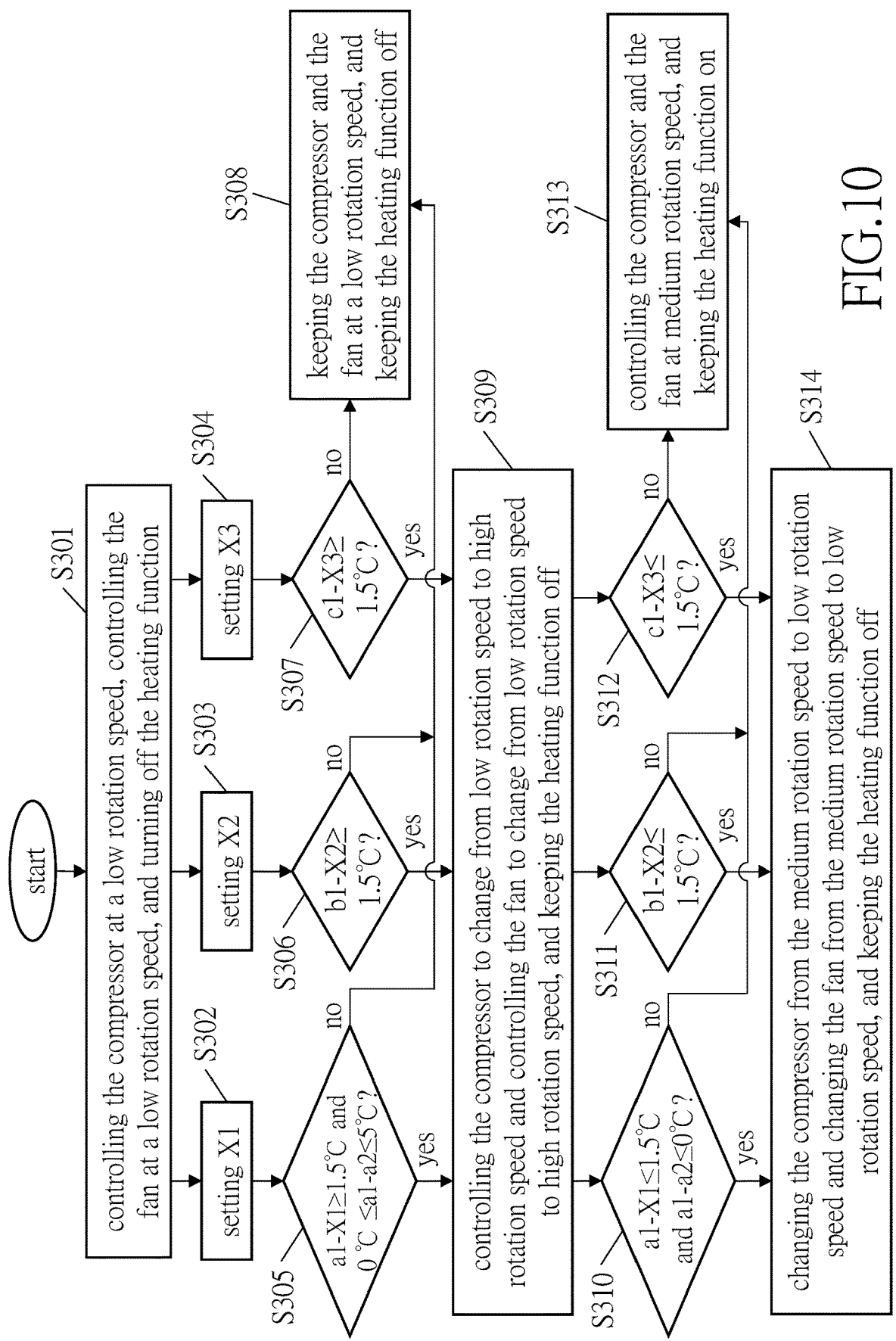
FIG. 10 is a flow chart of a control method of a composite thermostatic cooling system according to another embodiment of the invention.

Please refer to FIG. 1, FIG. 2 and FIG. 10, a control method for a composite thermostatic cooling system is provided according to another embodiment of the invention, which is suitable for thermostatic control of energy storage cabinet 1 at the operating ambient temperature of −10° C.~9° C.

Firstly, the composite thermostatic cooling system is started to operate, so that the coolant of the cooling devices 100~300 starts to circulate in the tube loops LOOP1~LOOP3, the heat exchange medium circulates in the tube loop LOOP4, and the temperature of the coolant is monitored through the temperature sensors LTS1~LTS4.

Steps S301~S304 are the same as steps S101~S104 and will not be repeated here.

Step S305: Determining whether the temperature a1 minus the operating temperature X1 is greater than or equal to 1.5° C., and whether the temperature a1 minus the temperature a2 is greater than or equal to 0° C. and less than or equal to 5° C.

Steps S306 to S308 are the same as steps S106 to S108 and will not be described here.

Step S309 is the same as Step S209 and will not be repeated here.

Step S310: Determining whether the temperature a1 minus the operating temperature X1 is less than or equal to 1.5° C., and determining whether the temperature a1 minus the temperature a2 is less than or equal to 0° C.

Steps S311 and S312 are the same as steps S111 and S112 and will not be repeated here.

In steps S310 to S312, if no, in step S313, controlling the compressor COMP speed at medium rotation speed and controlling the fan F at medium rotation speed, and turning on the heating function. To turn on the heating function is to turn on the switches M1 and M2 and turn off the switch CV. Otherwise, in steps S310 to S312, if yes, in step S314, changing the compressor COMP from the medium rotation speed to low rotation speed and changing the fan F from medium rotation speed to low rotation speed, and keeping the heating function off.

Figure 3:
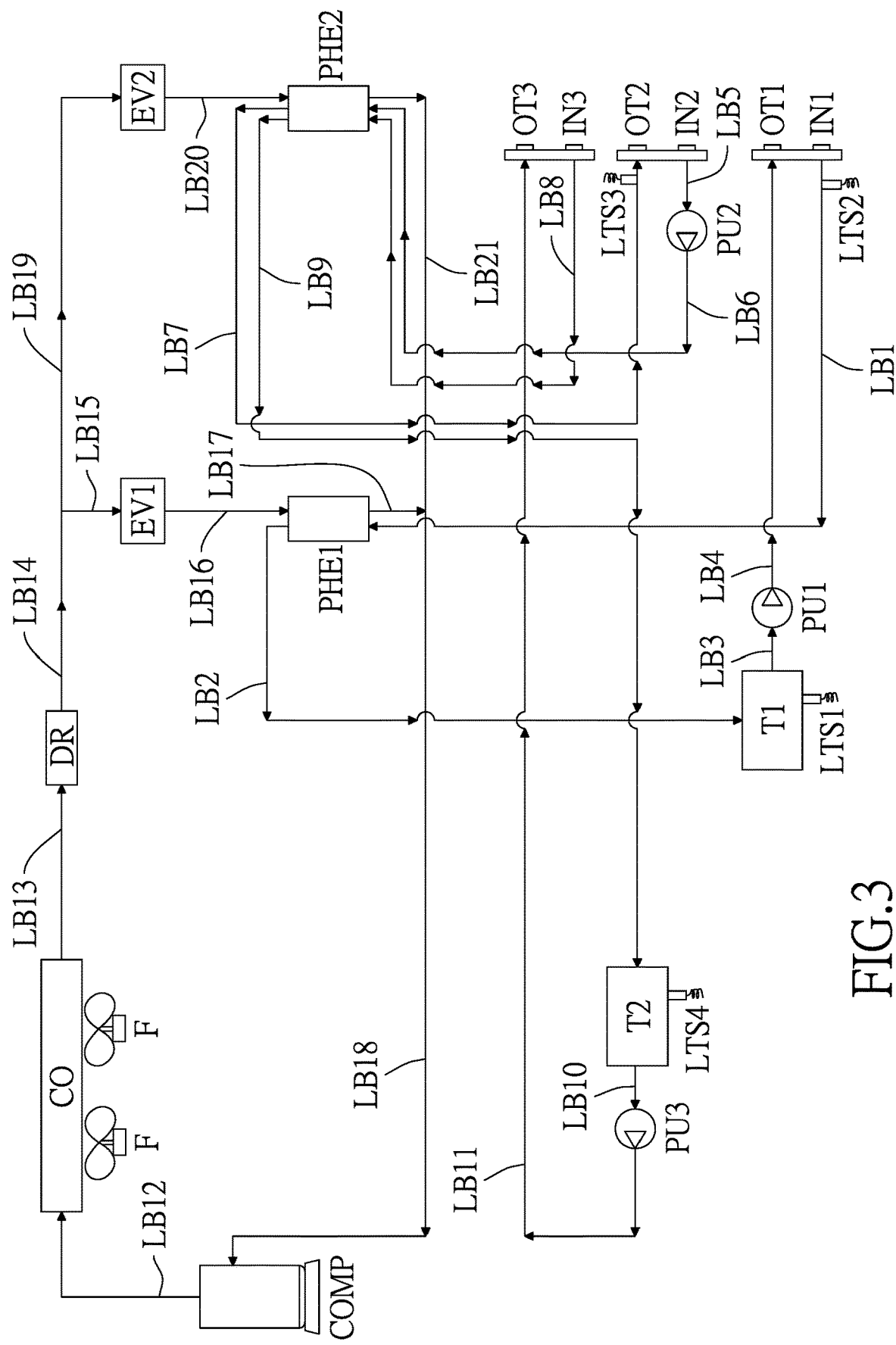
FIG. 3 is a schematic diagram of a part of a composite thermostatic cooling system according to another embodiment of the invention.

In addition, referring to FIG. 3, another composite thermostatic cooling system is provided according to an embodiment of the invention, which includes, for example, but not limited to, the configurations similar to those in FIG. 1 and FIG. 2, but omits the heater H, the switches M1, M2 and CV and the tubes LB22~LB25 in FIG. 2 and therefore does not have a heating function but still provides three forms of cooling.

The control method of this composite thermostatic cooling system can be referred to the control method in FIG. 8 and FIG. 9, which will not be repeated here.

Figure 4:
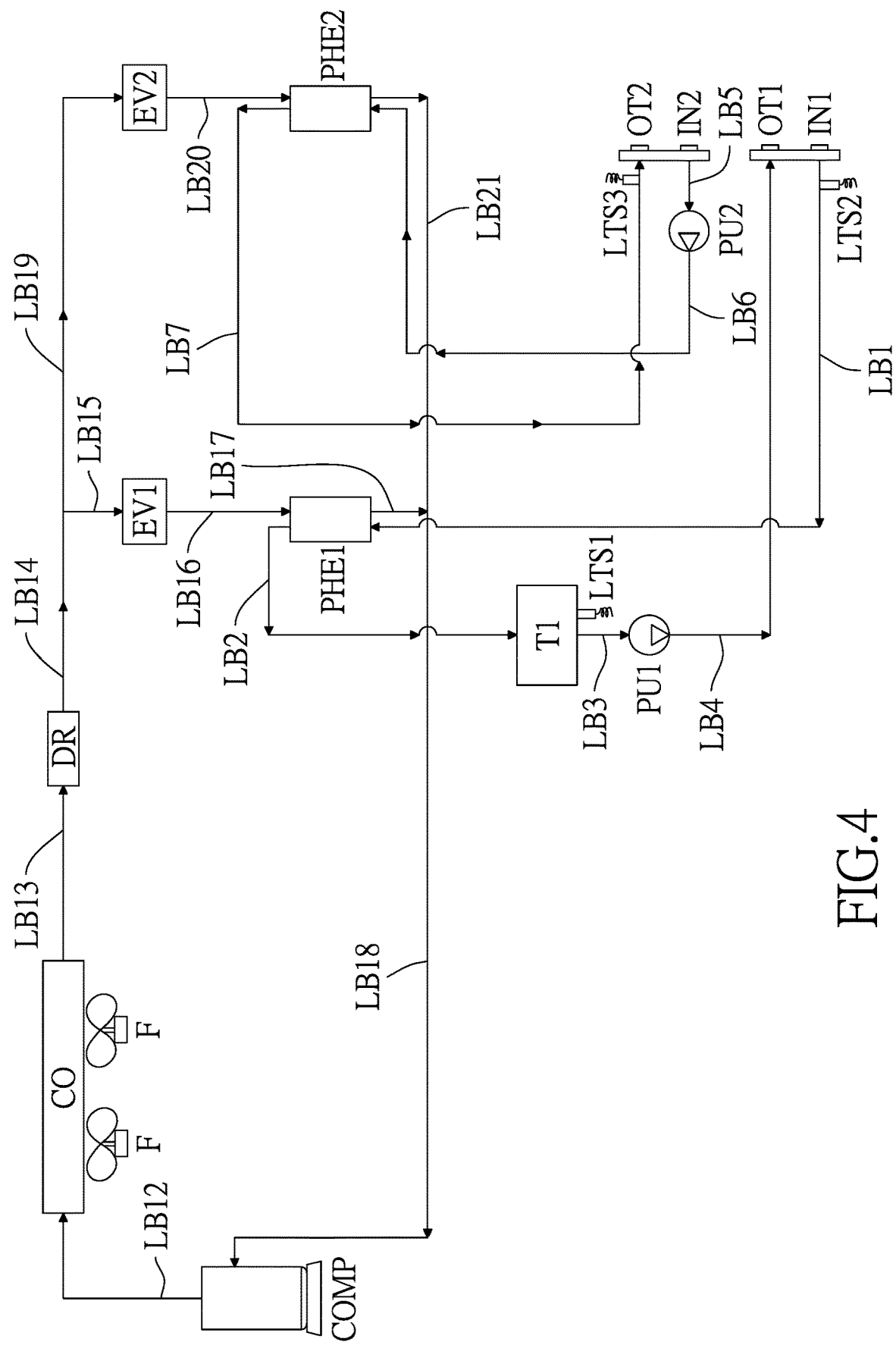
FIG. 4 is a schematic diagram of a part of a composite thermostatic cooling system according to another embodiment of the invention.

Please refer to FIG. 4, another composite thermostatic cooling system is provided according to an embodiment of the invention, which includes, for example, but not limited to, the configurations similar to those in FIG. 2, but omits the input port IN3 and the output port OT3 in FIG. 2 connected to the cooling device 300 in FIG. 1, and the coolant storage tank T2, the pump PU3, the tubes LB8~LB11, the temperature sensor LTS4, the heater H, the switches M1, M2 and CV and the tubes LB22~LB25 in FIG. 2 are also omitted. Therefore, this composite thermostatic cooling system is suitable for the energy storage cabinet that does not have the heat generation source corresponding to the cooling device 300 in FIG. 1, providing two forms of cooling and without heating function.

The control method of this composite thermostatic cooling system can be referred to the control method in FIG. 8 and FIG. 9, but steps S104, S107 and S112 in FIG. 8 and steps S204, S207 and S212 in FIG. 9 are omitted, which will not be repeated here.

Figure 5:
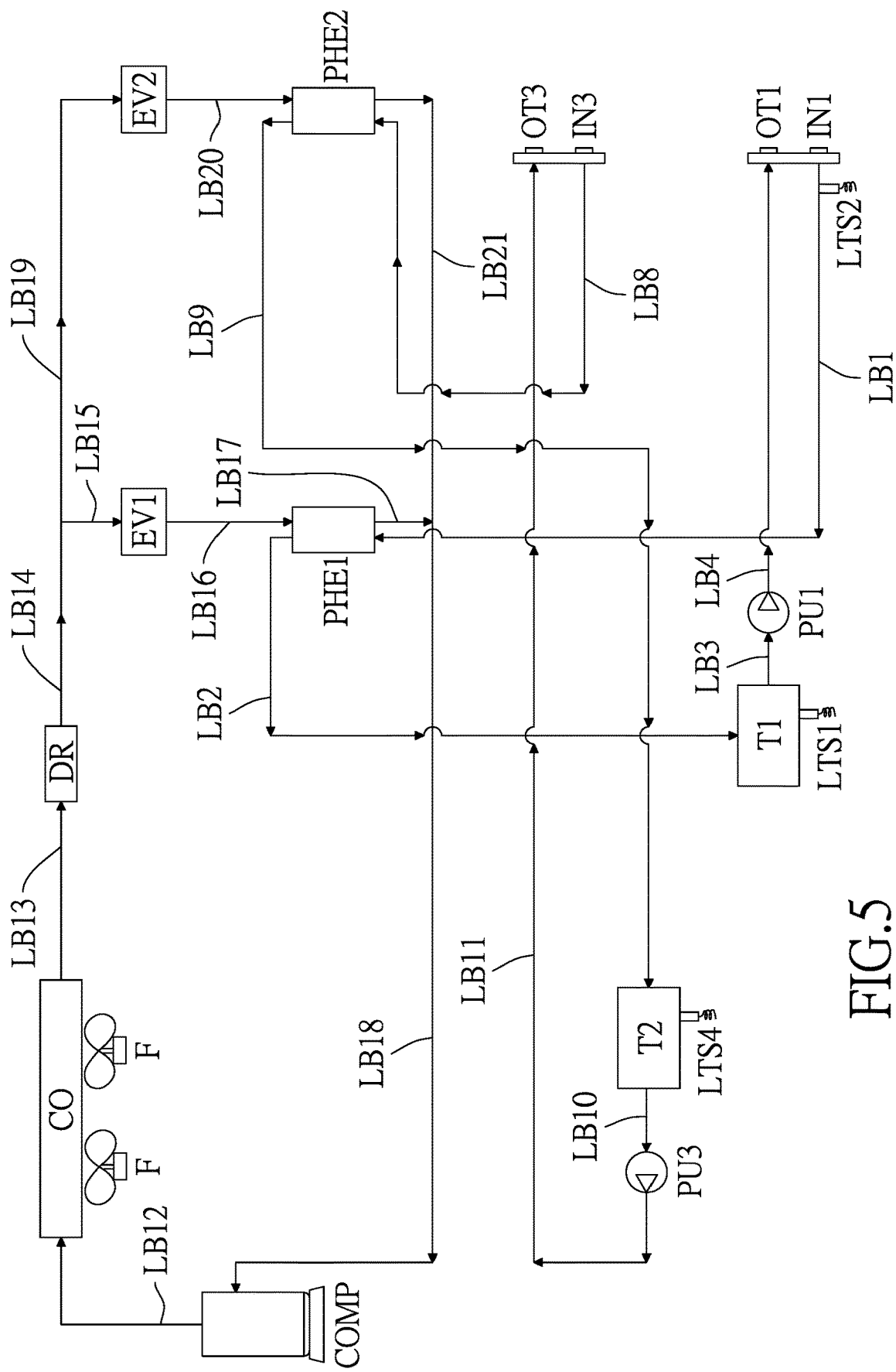
FIG. 5 is a schematic diagram of a part of a composite thermostatic cooling system according to another embodiment of the invention.

Please refer to FIG. 5, another composite thermostatic cooling system is provided according to an embodiment of the invention, which includes, for example, but not limited to, the configurations similar to those in FIG. 2, but omits the input port IN2 and the output port OT2 in FIG. 2 connected to the cooling device 200 in FIG. 1, and the pump PU2, the tubes LB5~LB7, the temperature sensor LTS3, the heater H, the switches M1, M2 and CV and the tubes LB22~LB25 in FIG. 2 are also omitted. Therefore, this composite thermostatic cooling system is suitable for the energy storage cabinet without the heat generation source corresponding to the cooling device 200 in FIG. 1, and provides two forms of cooling and does not have heating function.

The control method of this composite thermostatic cooling system can be referred to the control method in FIG. 8 and FIG. 9, but steps S103, S106 and S111 in FIG. 8 and steps S203, S206 and S211 in FIG. 9 are omitted and will not be repeated here.

Figure 6:
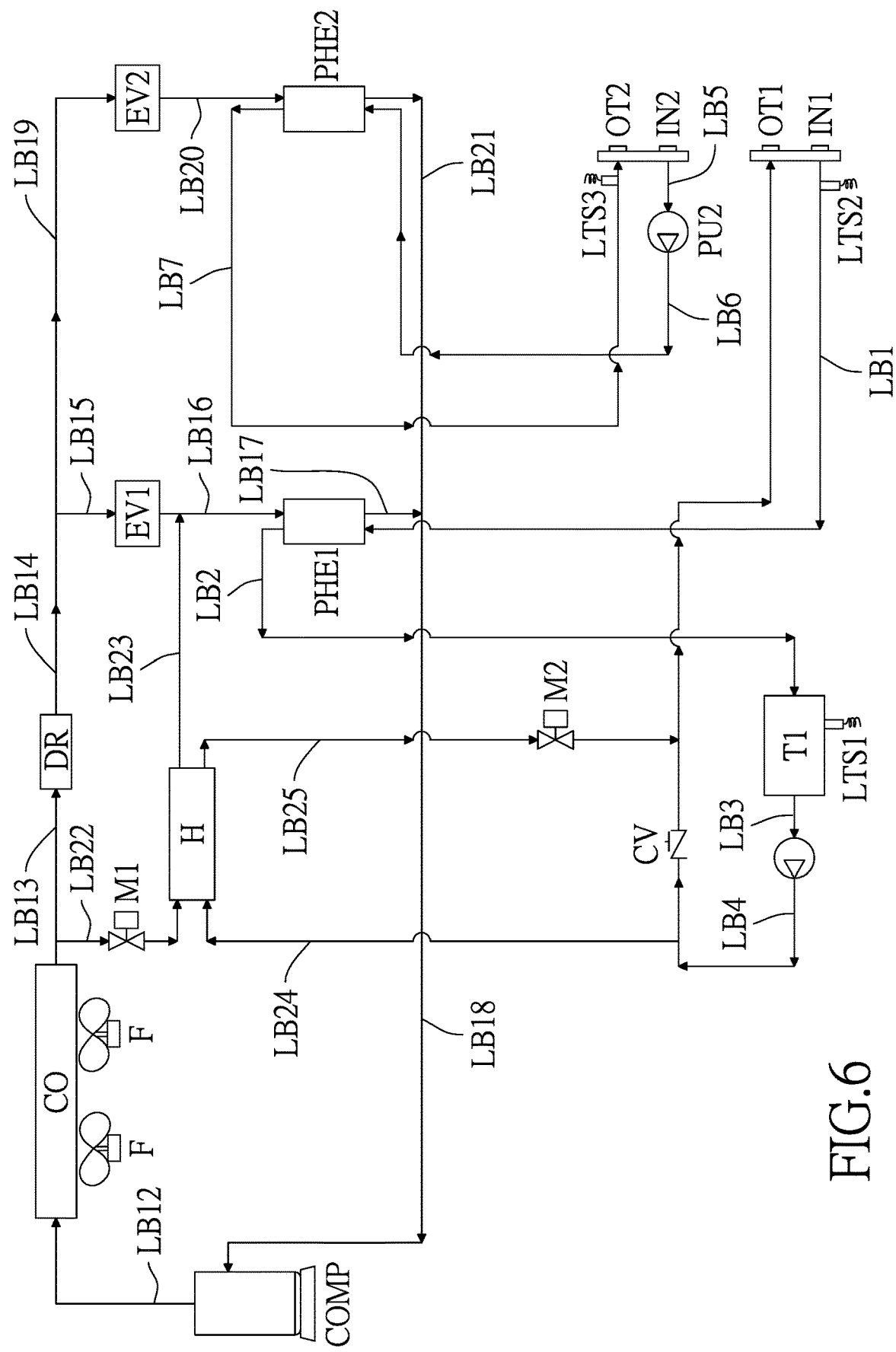
FIG. 6 is a schematic diagram of a part of a composite thermostatic cooling system according to another embodiment of the invention.

Please refer to FIG. 6, another composite thermostatic cooling system is provided according to an embodiment of the invention, which includes, for example, but not limited to, the configurations similar to those in FIG. 2, but omits the input port IN3 and the output port OT3 in FIG. 2 connected to the cooling device 300 in FIG. 1, and the coolant storage tank T2, the pump PU3, the tubes LB8~LB11 and the temperature sensor LTS4 in FIG. 2 are also omitted. Therefore, this composite thermostatic cooling system is suitable for energy storage cabinets that do not have the heat generation source corresponding to the cooling device 300 in FIG. 1, and provides two forms of cooling.

The control method of this composite thermostatic cooling system can be referred to the control method in FIG. 8-10, but steps S104, S107 and S112 in FIG. 8, steps S204, S207 and S212 in FIG. 9 and steps S304, S307 and S312 in FIG. 10 are omitted, which will not be repeated here.

Figure 7:
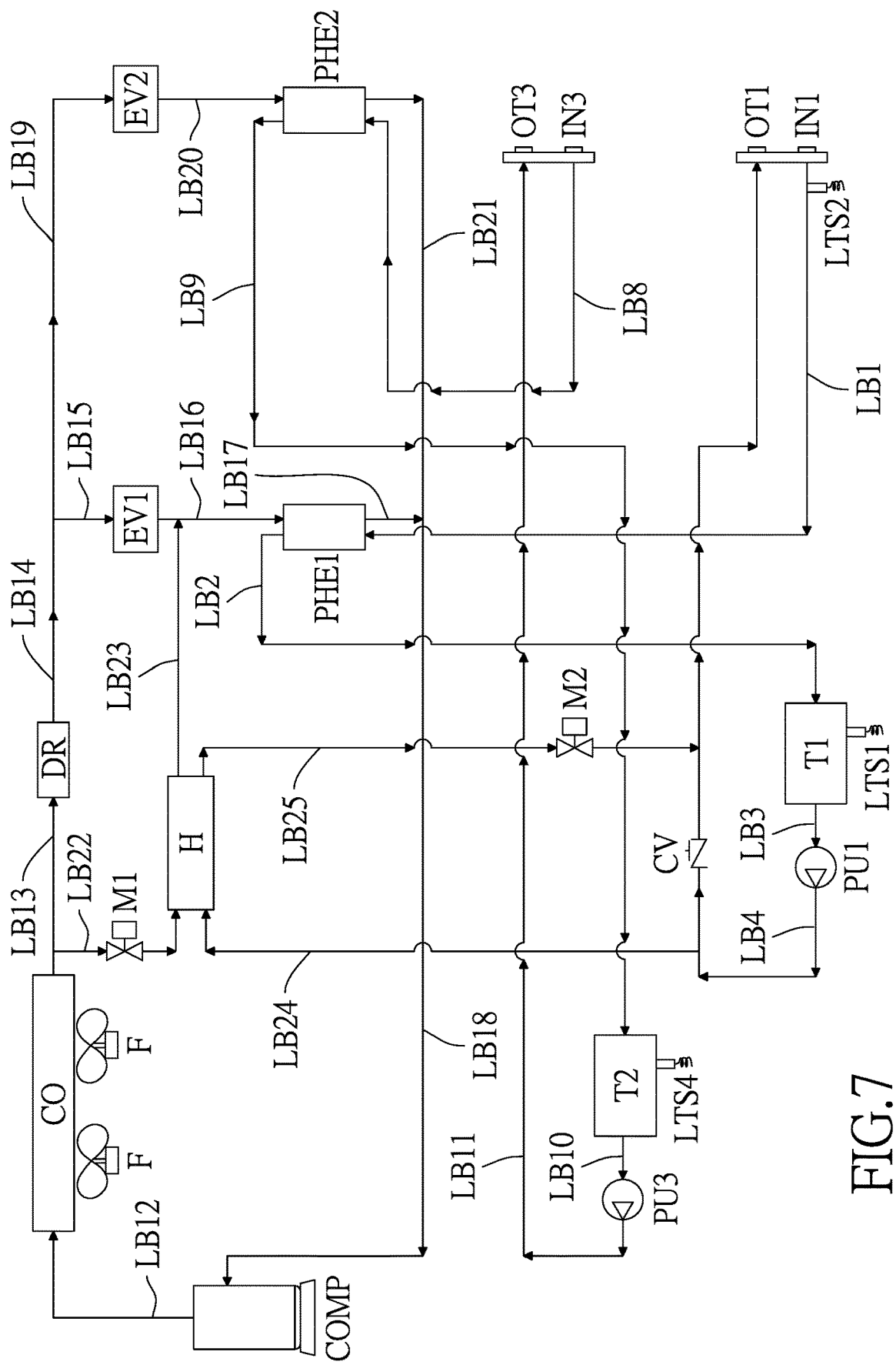
FIG. 7 is a schematic diagram of a part of a composite thermostatic cooling system according to another embodiment of the invention.

Please refer to FIG. 7, another composite thermostatic cooling system is provided according to an embodiment of the invention, which includes, for example, but is not limited to, the configuration similar to that in FIG. 2, but omits the input port IN2 and the output port OT2 of the cooling device 200 in FIG. 2 connected to the cooling device 200 in FIG. 1, and the pump PU2, the tube LB5-LB7 and the temperature sensor LTS3 in FIG. 2 are also omitted. Therefore, this composite thermostatic cooling system is suitable for the energy storage cabinet that does not have the heat generation source corresponding to the cooling device 200 in FIG. 1, and provides two forms of cooling.

The control method of this composite thermostatic cooling system can be referred to the control method in FIG. 8 to FIG. 10, but steps S103, S106 and S111 in FIG. 8, steps S203, S206 and S211 in FIG. 9 and steps S303, S306 and S311 in FIG. 10 are omitted, which will not be repeated here.

In summary, the composite thermostatic cooling system efficiently maintains the respective heat generation sources in the storage space at the same operating temperature by using at least two types of cooling devices.

Although the invention is disclosed as such by the foregoing embodiments, these embodiments are not intended to restrict the invention. Within the spirit and scope of the invention, the modification, finishing and combination of each embodiment shall be within the scope of patent protection of the invention. For the scope of protection defined by the invention, please refer to the attached claims.

What is claimed is:

1. A composite thermostatic cooling system suitable for constant temperature control of a plurality of heat generation sources in a storage space, and comprising:
   a first type cooling device used to adjust a temperature of the storage space;
   a first heat exchanger for cooling a first coolant of the first type cooling device;
   a first tube loop in communication with the first type cooling device and the first heat exchanger, and used for the first coolant to circulate therein;
   a second type cooling device, including a set of storage boxes, each for storing a second coolant and at least one of the plurality of heat generation sources, wherein the second coolant is used to regulate the temperature of the plurality of heat generation sources in the storage box;
a second heat exchanger for cooling the second coolant;
a second tube loop in communication with the second type cooling device and the second heat exchanger, and used for the second coolant to circulate therein;
a compressor for pressurizing a heat exchange medium;
a condenser for cooling the heat exchange medium;
a dryer for drying the heat exchange medium;
two expansion valves for decompressing the heat exchange medium; and
a third tube loop including a main loop and two branches, wherein the main loop is in communication with the compressor, the condenser, the dryer and the two branches, one of the branches is connected with one of the two expansion valves and the first heat exchanger, the other of the two branches is connected with the other of the two expansion valves and the second heat exchanger, and the third tube loop allows the heat exchange medium to circulate therein.

2. The composite thermostatic cooling system as claimed in claim 1, wherein the first type cooling device is a liquid cooled air conditioner, and the second type cooling device is a one-way immersion liquid cooling device.

3. The composite thermostatic cooling system as claimed in claim 1, wherein the first type cooling device is a liquid cooled air conditioner, and the second type cooling device is a dual-phase immersion liquid cooling device or a heat exchanger.

4. The composite thermostatic cooling system as claimed in claim 1, wherein the set of storage boxes of the second type cooling device is defined as a first set of storage boxes, and the composite thermostatic cooling system further comprises:
a third type cooling device includes a second set of storage boxes, each of the second set of the storage boxes is provided for storage of a third coolant and the at least one of the plurality of the heat generation sources, and the third coolant is used for regulating the temperature of the heat generation sources in each one of the second set of storage boxes; and
a fourth tube loop is in communication with the third type cooling device and the second heat exchanger, and used for the third coolant to circulate therein.

5. The composite thermostatic cooling system as claimed in claim 4, wherein the first type cooling device is a liquid cooled air conditioner, the second type cooling device is a one-way immersion liquid cooling device, and the third type cooling device is a dual-phase immersion liquid cooling device or a heat exchanger.

6. The composite thermostatic cooling system as claimed in claim 4 further comprising:
a first coolant storage tank disposed on the first tube loop between an output end of the first heat exchanger and an output port of the first type cooling device and used for storage of the first coolant;
a second coolant storage tank disposed on the fourth tube loop between an output end of the second heat exchanger and an output port of the third type cooling device and used for storage of the third coolant;
a first temperature sensor disposed in the first coolant storage tank and used to detect the temperature of the first coolant in the first coolant storage tank;
a second temperature sensor disposed to the first tube loop between the first type cooling device and an input end of the first heat exchanger and used to detect the temperature of the first coolant discharged from the first type cooling device;
a third temperature sensor disposed to the second tube loop between an output end of the second heat exchanger and the second type cooling device and used to detect the temperature of the second coolant moved back to the second type cooling device; and
a fourth temperature sensor disposed in the second coolant storage tank and used to detect the temperature of the second coolant in the second coolant storage tank.

7. The composite thermostatic cooling system as claimed in claim 4 further comprising:
a heater used to heat the heat exchange medium and the first coolant;
a first heating tube connected with the heater and the third tube loop located between the condenser and the dryer, and used to move the heat exchange medium from the condenser to the heater;
a first switch disposed to the first heating tube and used for selective opening of the first heating tube;
a second heating tube connected with the heater and the branch between the expansion valve and the first heat exchanger, and used to move the heat exchanger medium from the heater to the first heat exchanger;
a second switch disposed to the first tube loop between an output end of the first heat exchanger and an output port of the first type cooling device, and used for selective opening of the first tube loop between the output end of the first heat exchanger and the first type cooling device;
a third heating tube connected with the heater and the first tube loop between the output end of the first heat exchanger and the second switch, and used to move the first coolant to the heater from the first tube loop between the output end of the first heat exchanger and the second switch;
a fourth heating pipe connected with the heater and the first tube loop between the second switch and the output port of the first type cooling device, and used for moving the first coolant from the heater to the first tube loop between the second switch and the output port of the first type cooling device; and
a third switch disposed to the fourth heating tube and used to selectively open the fourth heating tube.

8. The composite thermostatic cooling system as claimed in claim 1 further comprising:
a heater used to heat the heat exchange medium and the first coolant;
a first heating tube connected with the heater and the third tube loop located between the condenser and the dryer, and used to move the heat exchange medium from the condenser to the heater;
a first switch disposed to the first heating tube and used for selective opening of the first heating tube;
a second heating tube connected with the heater and the branch between the expansion valve and the first heat exchanger, and used to move the heat exchanger medium from the heater to the first heat exchanger;
a second switch disposed to the first tube loop between an output end of the first heat exchanger and an output port of the first type cooling device, and used for selective opening of the first tube loop between the output end of the first heat exchanger and the first type cooling device;
a third heating tube connected with the heater and the first tube loop between the output end of the first heat exchanger and the second switch, and used to move the first coolant to the heater from the first tube loop between the output end of the first heat exchanger and the second switch;
a fourth heating pipe connected with the heater and the first tube loop between the second switch and the output port of the first type cooling device, and used for moving the first coolant from the heater to the first tube loop between the second switch and the output port of the first type cooling device; and
a third switch disposed to the fourth heating tube and used to selectively open the fourth heating tube.

9. The composite thermostatic cooling system as claimed in claim 1 further comprising:
a coolant storage tank disposed on the first tube loop between an output end of the first heat exchanger and an output port of the first type cooling device and used for storage of the first coolant;
a first temperature sensor disposed in the coolant storage tank and used to detect the temperature of the first coolant in the coolant storage tank;
a second temperature sensor disposed to the first tube loop between the first type cooling device and an input end of the first heat exchanger and used to detect the temperature of the first coolant discharged from the first type cooling device; and
a third temperature sensor disposed to the second tube loop between an output end of the second heat exchanger and the second type cooling device and used to detect the temperature of the second coolant moved back to the second type cooling device.

10. The composite thermostatic cooling system as claimed in claim 1 further comprising:
a first coolant storage tank disposed on the first tube loop between an output end of the first heat exchanger and an output port of the first type cooling device and used for storage of the first coolant;
a second coolant storage tank disposed on the second tube loop between an output end of the second heat exchanger and an output port of the second type cooling device and used for storage of the second coolant;
a first temperature sensor disposed in the first coolant storage tank and used to detect the temperature of the first coolant in the first coolant storage tank; and
a second temperature sensor disposed in the second coolant storage tank and used to detect the temperature of the second coolant in the second coolant storage tank.

* * * * *